United States Patent
Hinze

(10) Patent No.: US 7,048,564 B1
(45) Date of Patent: May 23, 2006

(54) SEALED ELECTRONIC MODULE WITH FASTENERLESS CIRCUIT BOARD SUPPORT POST

(75) Inventor: Lee R. Hinze, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/139,796

(22) Filed: May 27, 2005

(51) Int. Cl.
H01R 13/52 (2006.01)

(52) U.S. Cl. .................. 439/276; 361/742; 361/758

(58) Field of Classification Search ............ 361/742, 361/758; 439/276
See application file for complete search history.

(56) References Cited

U.S. PATENT DOCUMENTS

| | | | | |
|---|---|---|---|---|
| 4,526,432 A | * | 7/1985 | Cronin et al. ............... | 439/320 |
| 5,703,754 A | | 12/1997 | Hinze | |
| 6,259,032 B1 | * | 7/2001 | Fernandez ............. | 174/138 E |
| 6,262,887 B1 | * | 7/2001 | Lee ........................... | 361/683 |
| 6,768,648 B1 | * | 7/2004 | Kobayashi .................. | 361/758 |
| 6,821,130 B1 | * | 11/2004 | Danley ....................... | 439/67 |
| 6,850,418 B1 | * | 2/2005 | Dutton et al. .............. | 361/752 |
| 2003/0017735 A1 | * | 1/2003 | Singh ......................... | 439/329 |
| 2004/0057217 A1 | * | 3/2004 | Dutton et al. .............. | 361/752 |

* cited by examiner

Primary Examiner—James R. Harvey
(74) Attorney, Agent, or Firm—Scott A. McBain

(57) ABSTRACT

A sealed electronic module includes a housing having an open end and a circuit board that is both peripherally and centrally supported within the housing, where potting material applied to the exposed face of the circuit board peripherally and centrally affixes the circuit board to the housing and also environmentally seals the module. The central support for the circuit board is provided by a support post that is integral with the housing. A reduced size tip of the support post extends through an opening formed in a central area of the circuit board, and potting material applied to the exposed face of the circuit board for sealing the module also flows into the circuit board opening around the tip of the support post. The cured potting material structurally bonds the periphery of the circuit board to the housing walls and the central area of the circuit board to the housing support post.

3 Claims, 2 Drawing Sheets

SEALED ELECTRONIC MODULE WITH FASTENERLESS CIRCUIT BOARD SUPPORT POST

TECHNICAL FIELD

The present invention relates to an electronic module including a circuit board and a housing that is sealed with potting material, and more particularly to a housing support post for rigidly supporting a central portion of the circuit board without the use of fasteners.

BACKGROUND OF THE INVENTION

In the manufacture of an electronic module, a circuit board populated with electronic components is inserted into a plastic or metal housing that is open on one end. In a typical application, the circuit board is supported on one or more internal posts on the bottom face of the housing, fasteners are used to rigidly affix the circuit board to the posts, and a sealed cover is secured to the housing to seal the module. In an alternative approach described in the U.S. Pat. No. 5,703,754 to Hinze, the housing is provided with an interior ledge that supports the periphery of the circuit board, and the circuit board is inserted into the housing with at least the large components facing downward so that potting material can be applied to the exposed face of the circuit board to both affix the circuit board to the housing and environmentally seal the module. The approach disclosed by Hinze is particularly advantageous because it eliminates the fasteners that are otherwise required to secure the circuit board and housing cover. In certain applications, however, circuit board may require additional structural support due to its size or the nature of the electronic components mounted on it, and it would be desirable to provide the additional structural support without adding fasteners.

SUMMARY OF THE INVENTION

The present invention is directed to an improved electronic module including a housing having an open end and a circuit board that is both peripherally and centrally supported within the housing, where potting material applied to the exposed face of the circuit board peripherally and centrally affixes the circuit board to the housing and also environmentally seals the module. The central support for the circuit board is provided by a support post that is integral with the housing. A reduced size tip of the support post extends through an opening formed in a central area of the circuit board, and potting material applied to the exposed face of the circuit board for sealing the module also flows into the circuit board opening around the tip of the support post. The cured potting material structurally bonds the periphery of the circuit board to the housing walls and the central area of the circuit board to the housing support post.

DESCRIPTION OF THE PREFERRED EMBODIMENT

Figure 1:
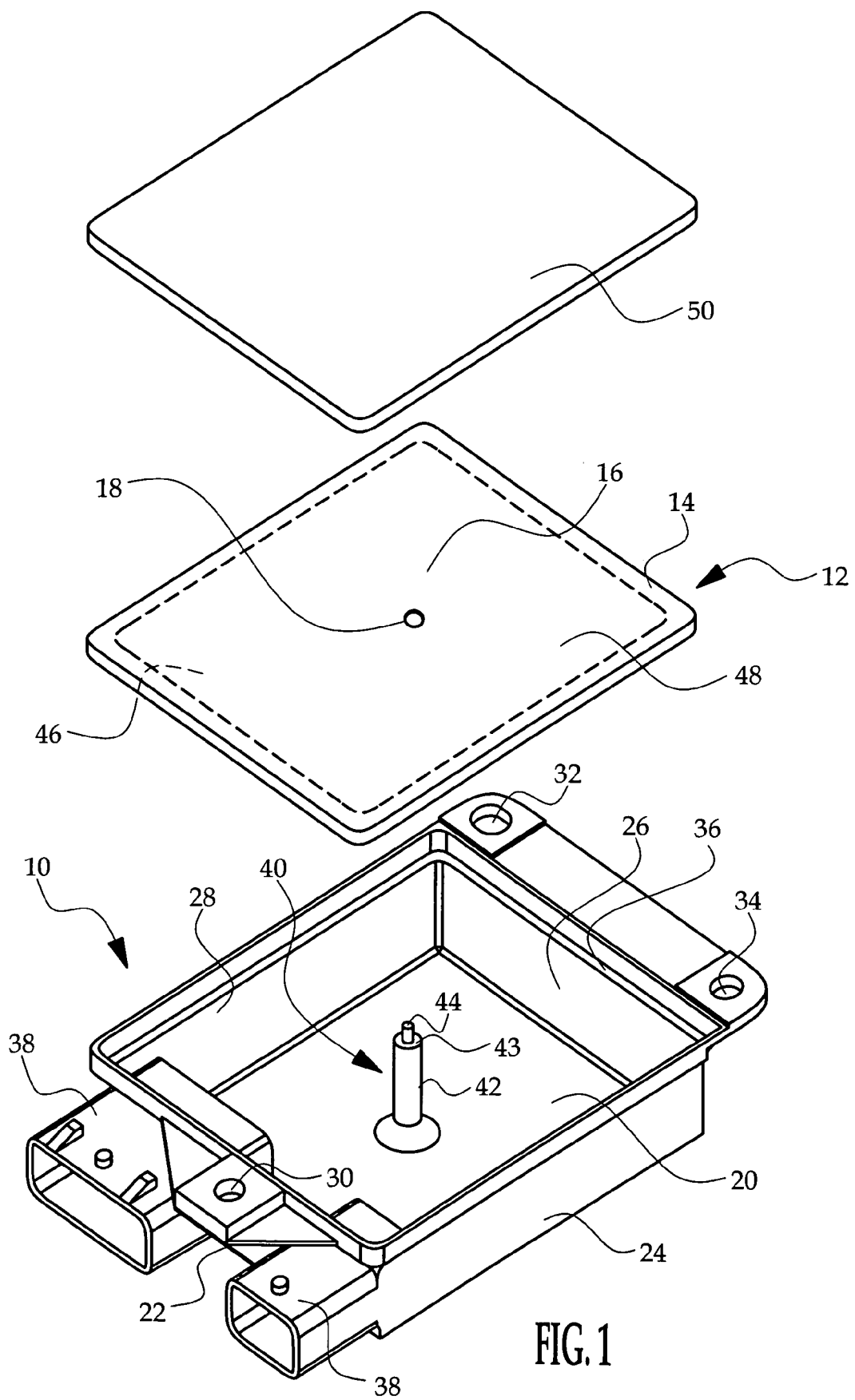
FIG. 1 is an exploded view of an electronic module assembly including a circuit board support post according to this invention.

Referring to FIG. 1, the reference numeral 10 generally designates a cast or molded housing and the reference numeral 12 generally designates a circuit board populated with electronic components. In general, the circuit board 12 is installed into the housing 10, and then sealed in place with a potting material such as polyurethane. The housing 10 supports the periphery or margin 14 of circuit board 12 as well as a central area 16 of circuit board 12. An opening or aperture 18 in the central area 16 of circuit board 12 facilitates the central support, as explained below.

The housing 10 includes a bottom 20, side walls 22, 24, 26, 28 and a set of integral mounting tabs 30, 32, 34. The housing 10 is open-ended as shown to receive the populated circuit board 12, and the interior faces of side walls 22, 24, 26, 28 are stepped to define an interior ledge 36 for peripherally supporting circuit board 12. The housing side wall 22 includes integral connector headers 38 supporting terminals (not shown) that are electrically coupled to contacts or plated openings formed on circuit board 12.

The reference numeral 40 generally designates a support post that extends out of the housing bottom 20—that is, toward the open end of housing 10. Preferably, housing 10 and support post 40 are molded or cast as a unitary structure so that the support post 40 is integral with the housing 10. The support post 40 has a main body portion 42 and a smaller sized tip 44 that extends beyond the main body portion 42, forming a shoulder 43 that surrounds the base of tip 44. The main body portion 42 extends from the housing bottom 20 to the plane of the interior ledge 36 so that the shoulder 43 also lies in the plane of the interior ledge 36. In the illustrated embodiment, the body portion 42 and tip 44 are both cylindrical, but of course other shapes could be used. When the circuit board 12 is inserted into the housing 10, the tip 44 of support post 40 extends through the circuit board opening 18, allowing the circuit board 12 to rest on both the interior ledge 36 and the shoulder 43 of support post 40. The electronic components carried by circuit board 12 are primarily placed on the hidden or inboard face 46 of circuit board 12, but in some applications, small components that will not be damaged by potting material can be placed on the exposed face 48 of circuit board 12.

Figure 2:
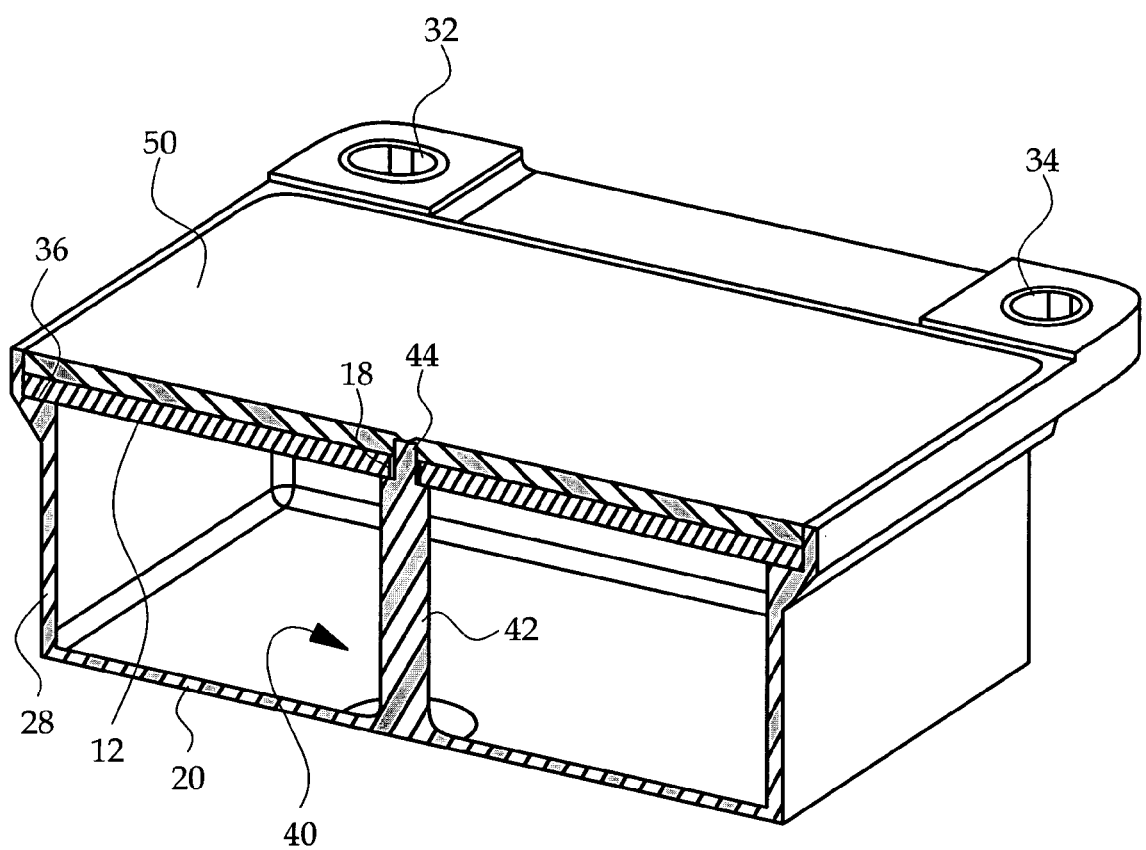
FIG. 2 is a cross-sectional view of a completed electronic module according to this invention, taken through the circuit board support post of FIG. 1.

A quantity of potting material 50 applied to the exposed face 48 of circuit board 12 floods a volume bounded by the exposed face 48 and portions of the housing side walls 22, 24, 26, 28 that extend beyond circuit board 12, flowing into the circuit board opening 18 around the tip 44 of support post 40. The potting material 50 adheres to the circuit board 12, the housing side walls 22, 24, 26, 28 and the tip 44 of support post 40 so that when cured, it closes and environmentally seals housing 10 and structurally bonds the circuit board 12 to the housing 10. The circuit board 10 is bonded to the housing side walls 22, 24, 26, 28 at its periphery 14 and to the housing support post 40 at its central area 16. Optionally, the support post tip 44 may be longer than shown in FIGS. 1–2 so that it extends beyond the exposed face 48 of circuit board 12 to provide increased bonding surface area near the central area 16 of circuit board 12.

In summary, the present invention provides a sealed electronic module with fastenerless support of both marginal and central areas of an enclosed circuit board. While the present invention has been described in reference to the illustrated embodiment, it will be recognized that various modifications will occur to those skilled in the art. For example, the housing 10 may have a shape other than rectangular, and so on. Accordingly, it is intended that the invention not be limited to the disclosed embodiment, but that it have the full scope permitted by the language of the following claims.

The invention claimed is:

1. A sealed electronic module comprising:
   a housing having an open end, an interior peripheral ledge, and a central support post extending from a bottom face of said housing toward said open end, said support post having a main body portion that terminates at a plane defined by said interior peripheral ledge and a tip portion that extends beyond said main body portion;
   a circuit board peripherally supported by said interior peripheral ledge and centrally supported by the main body portion of said support post, said circuit board having an aperture through which the tip portion of said support post extends, said aperture being over-sized relative to said tip portion; and
   a quantity of potting material filling a region defined by an outboard face of said circuit board and an inner periphery of said housing to seal the open end of said housing, where said potting material additionally surrounds the tip portion of said support post within said aperture.

2. The sealed electronic module of claim 1, wherein the main body portion of said support post contacts a region of said circuit board surrounding said aperture to support said circuit board.

3. The sealed electronic module of claim 1, wherein said housing and support post are molded as a unitary structure.

* * * * *